US006405154B1

(12) United States Patent
Ryan

(10) Patent No.: US 6,405,154 B1
(45) Date of Patent: Jun. 11, 2002

(54) METHOD AND APPARATUS FOR POWER ELECTRONICS HEALTH MONITORING

(75) Inventor: Michael John Ryan, Cohoes, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/473,663

(22) Filed: Dec. 29, 1999

(51) Int. Cl.[7] .............................................. H03K 17/60
(52) U.S. Cl. ......................... 702/183; 376/215; 361/25
(58) Field of Search ................................ 702/183, 185;
361/25, 78, 203; 73/570, 579, 660; 376/215,
216; 327/374, 339, 488

(56) References Cited

U.S. PATENT DOCUMENTS

| 4,454,503 A | 6/1984 | Konrad ........................ 340/648 |
| 4,612,620 A | 9/1986 | Davis et al. |
| 4,910,416 A | 3/1990 | Salcone ....................... 307/254 |
| 5,311,562 A | 5/1994 | Palusamy et al. ........... 376/215 |
| 5,440,566 A | 8/1995 | Spence et al. ................. 374/41 |
| 5,528,446 A | * 6/1996 | Sankaran et al. ............. 361/25 |
| 5,945,850 A | * 8/1999 | Segan et al. ................... 327/24 |

OTHER PUBLICATIONS

FP Dawson, et al, "Thermal Diagnostics of High Power Electrical and Optical Device Time to Failure" Conf. Proc. IEEE IAS Annual Meeting, pp. 1248–1255, 1993.
A. Hamidi, et al, "Reliability of High Power IGBT Modules: Testing on Thermal Fatigue Effects Due to Traction Cycles" Conf. Proc. EPE '97, 1997, pp. 3.118–3.123.
M. Hatle, et al, "Advanced Methods for Diagnostics of the GTO Thyristor", Microelectronics Journal, 24 (1993) pp. 147–155.

* cited by examiner

*Primary Examiner*—Kamini Shah
(74) *Attorney, Agent, or Firm*—Ann M. Agosti; Jill M. Breedlove

(57) ABSTRACT

A method for monitoring the health of power electronics includes: providing a switch command to a power electronic device (12) through a gate driver (14); measuring a switching time of the power electronic device; and using the switching time to determine a diagnostic condition of the power electronic device and/or the gate driver.

21 Claims, 2 Drawing Sheets

METHOD AND APPARATUS FOR POWER ELECTRONICS HEALTH MONITORING

BACKGROUND

The invention relates generally to power electronics and more particularly to health monitoring of power electronics.

Power electronics including gate drivers and power electronic devices such as transistors, thyristors, and gate turn off thyristors, for example, are used in electronic systems such as inverters, rectifiers, and other converters, for example. Sudden failures of power electronics often occur without warning (that is, without an obvious degradation of device or system performance). Failures in gate drivers and power electronic devices can be particularly troublesome for power electronic equipment operating in critical systems, such as, for example, transportation systems (locomotives, aircraft, automotive), communication systems, utility systems, medical systems, data processing, manufacturing, and industrial systems.

Conventional diagnostic techniques for monitoring power electronic devices use highly invasive and/or destructive testing to determine the condition of a power electronic device. For two examples of such conventional techniques, see Hatle, M., Vobecky, J., "Advanced methods for diagnostics of the GTO thyristor", Microelectronics Journal, January 1993, vol. 24, no. 1–2, p. 147–155, and Dawson, F. P., Ruda, H., "Thermal Diagnostics of High Power Electrical and Optical Device Time to Failure", Conf. Proceedings. IEEE IAS Annual Meeting, 1993, p. 1248–1255. The methods described are unsuitable for testing power electronic devices while the power electronic devices are being used in a converter.

SUMMARY

It would therefore be desirable to have a less invasive method and apparatus for determining the condition of the power electronic elements even when the power electronic devices are being used in a converter. Such a diagnostic measurement can be used to gauge the degradation of the power electronics over time for the purposes of failure prediction. In addition such diagnostic measurements can be used to determine the condition of ancillary systems such as, for example, cooling systems.

Briefly, according to one embodiment of the present invention, a method for monitoring the health of power electronics includes: providing a switch command to a power electronic device through a gate driver; measuring a switching time of the power electronic device; and using the switching time to determine a diagnostic condition of the power electronic device or the gate driver.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
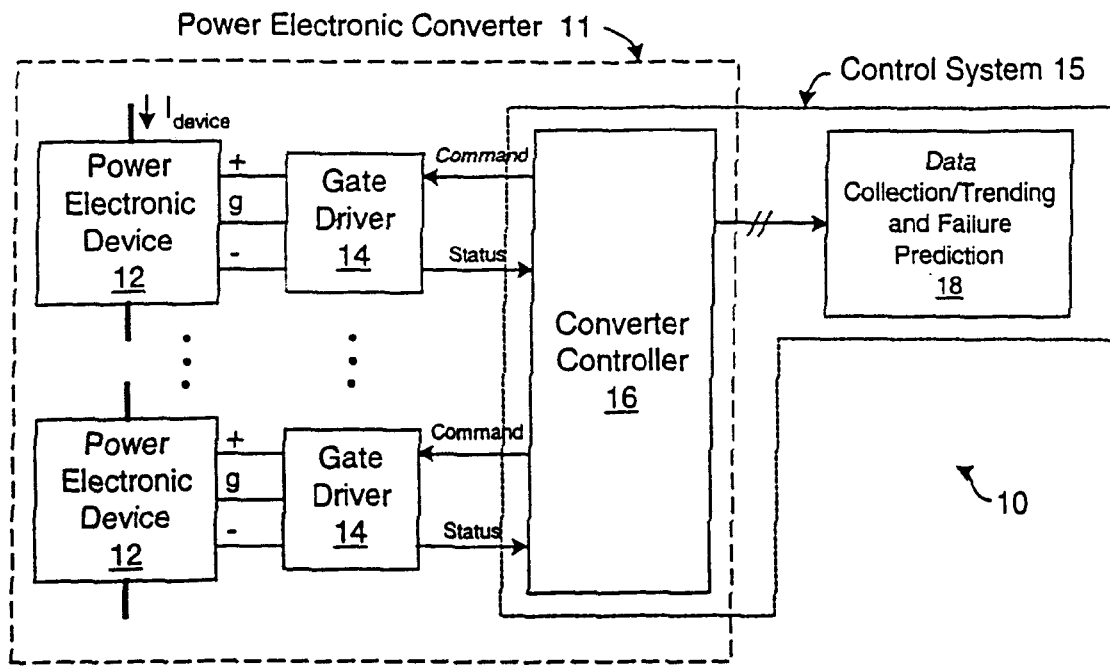
FIG. 1 is a block diagram of a health monitoring system and a remote data collector according to one embodiment of the present invention.
Figure 2:
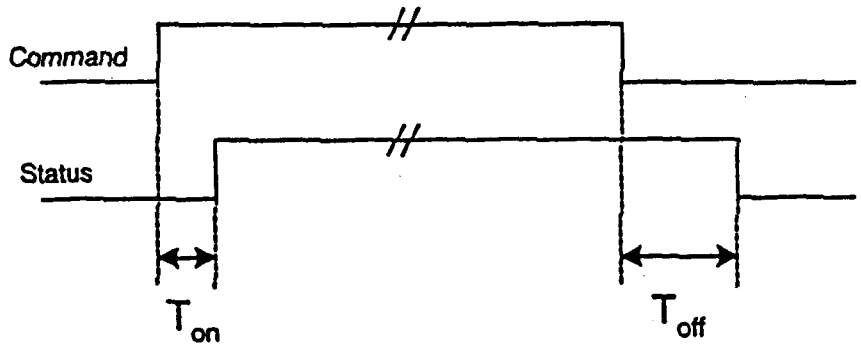
FIG. 2 is a graph illustrating example switching time measurements that can be obtained by and used in the embodiment of FIG. 1.

FIG. 1 is a block diagram of a health monitoring system 10 and a remote data collector 18 according to one embodiment of the present invention, and FIG. 2 is a graph illustrating example switching time measurements that can be obtained by and used in the embodiment of FIG. 1.

In one embodiment of the present invention, a method for monitoring the health of power electronics includes providing at least one switch command to at least one power electronic device 12 through at least one gate driver 14, measuring at least one switching time of the at least one power electronic device, and using the at least one switching time to determine at least one diagnostic condition of the at least one power electronic device or the at least one gate driver (that is, determine at least one diagnostic condition of either or both of the electronic device and the gate driver). The diagnostic information can be used for gauging degradation and predicting failures in the electronic device or the gate driver.

Under typical operation of a power electronic converter 11 hundreds or even thousands of switching events can be measured every second. The regression of these measurements will provide an effective means of data reduction and will produce a very high-resolution, time-averaged and noise-immune signature for each power electronic device 12/gate driver 14 pair. The signature of each switch in a converter is monitored over time for indication of degradation and impending failure. The change in signature can be judged either specifically over time for a given pair, or generally against certain bounds expected for all switches of a certain type. Certain characteristic changes in the signature can be further utilized to isolate which component in the power electronic device 12/gate driver 14 pair is degrading. Furthermore, the signatures of all the power electronic elements in a converter can be taken as a group, or subgroups, to determine the diagnostic condition of the converter system outside of individual device degradation. Such analysis could, for example, determine the condition of the converter cooling system, the quality of power supplied to the converter, or the regulation of the load controlled by the converter.

The known degradation modes of power electronics impinge on the switching characteristics of a device in several ways. Typically, power semiconductor devices are comprised of many devices in parallel: either as individual segments on the silicon die (as in a GTO (gate turn-off thyristor)), or as many dies connected together in a single package (as with most large IGBT (insulated gate bipolar transistors) modules). Partial failure of the device, where some of these segments or dies cease to function, can result in longer transition times (that is, turn-on and/or turn-off times) for a given amount of device current. Higher device junction temperatures can result in prolonged switching times, and can be caused by several factors related to degradation including: higher leakage currents, higher on-state voltages due to bond-wires lifting, and higher thermal impedance due to die delamination, for example. On a system-level, loss of converter cooling will also increase device temperature and will increase the switching times of the devices in a converter as a group.

In the gate driver of each device there typically exists one or more power supplies (not shown) that incorporate electrolytic capacitors. Over time, these capacitors experience a decrease in capacitance and increase in equivalent series resistance (ESR) and temperature. Such degradation reduces the strength of the gate driver output and correspondingly prolongs the switching transitions of the device. Likewise, the gate driver often has several power electronic devices (e.g. MOSFETs) operating in its output circuitry. A failure of one or more of these devices will also prolong the switching times of power electronic device 12.

Referring more particularly to FIG. 1, a control system 15 can be used to send a signal "Command" to a respective gate driver 14 and to receive a switch state status signal "Status" from gate driver 14, to use the status signal to measure at least one switching time of the at least one power electronic device 12; and to use the switching time to determine the diagnostic condition of the at least one power electronic device and/or the at least one gate driver. The control system can be located proximate to and/or remote from the power electronic converter. Additionally the control system may comprise one or more units or computers. In one embodiment, control system comprises (a) a converter controller 16 situated proximate to (as represented in FIG. 1) power electronic devices 12 and gate drivers 14 for providing the command signal and receiving the status signal and (b) a remote date collector 18 situated remote from the converter controller 16 for collecting the data and gauging degradation/predicting failures.

Although a single switching time can provide useful information, it is further useful to measure at least two switching times with one of the switching times comprising a turn-on time and the other comprising a turn-off time. Referring to FIG. 2, the turn-on time $T_{on}$ is represented as the time between the sending of an "on" switch command signal and the receiving of an "on" switch position status signal (Status), and the turn-off time $T_{off}$ is represented as the time between the sending of an "off" switch command signal and the receiving of an "off" switch position status signal.

Each of the turn-on and turn-off times can be both analyzed and stored for future analysis. In one embodiment, the turn-on and turn-off times are trended, and the trended data is used in conjunction with newly acquired switching times to determine condition/gauge degradation I predict failures. Trending switching time data is an effective approach to health monitoring because the switching times are affected by both the strength of the gate driver and the health of the power electronic device. Therefore, switching times can be trended and monitored for changes in the switching time profile that can indicate a degradation of either the gate driver or the power electronic device.

As discussed above, the turn-on and turn-off times can be stored and/or trended either proximate to the power electronic device 12 and gate driver 14 or at a location remote from the power electronics such as in remote data collector 18.

Figure 3:
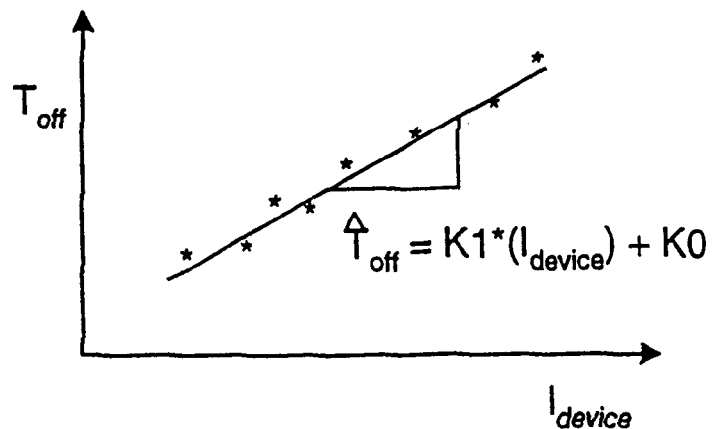
FIG. 3 is a graph illustrating example switching time normalization and signature formation through linear regression.

FIG. 3 is a graph illustrating example switching time normalization and signature formation through linear regression. In one embodiment, prior to storing each of the turn-on and turn-off times, each of the turn-on and turn-off times is normalized. The normalization can be based on parameters such as current in the power electronic device, ambient temperature, and/or bus voltage in the power electronics, for example.

Using the present invention, if each power electronic device and its associated gate driver are monitored, the diagnostic condition can be determined, degradation can be gauged, and a failure can be predicted. The device can then be changed out to prevent a corresponding failure of the electronic system supported by the device. The diagnostic data from all the devices in a converter can be additionally taken as a group to identify a system-level problem, such as cooling, which can be corrected before a failure is produced.

EXAMPLE

Several tests were performed wherein the power electronic converter comprised an inverter and the power electronic device comprised a GTO.

Figure 4:
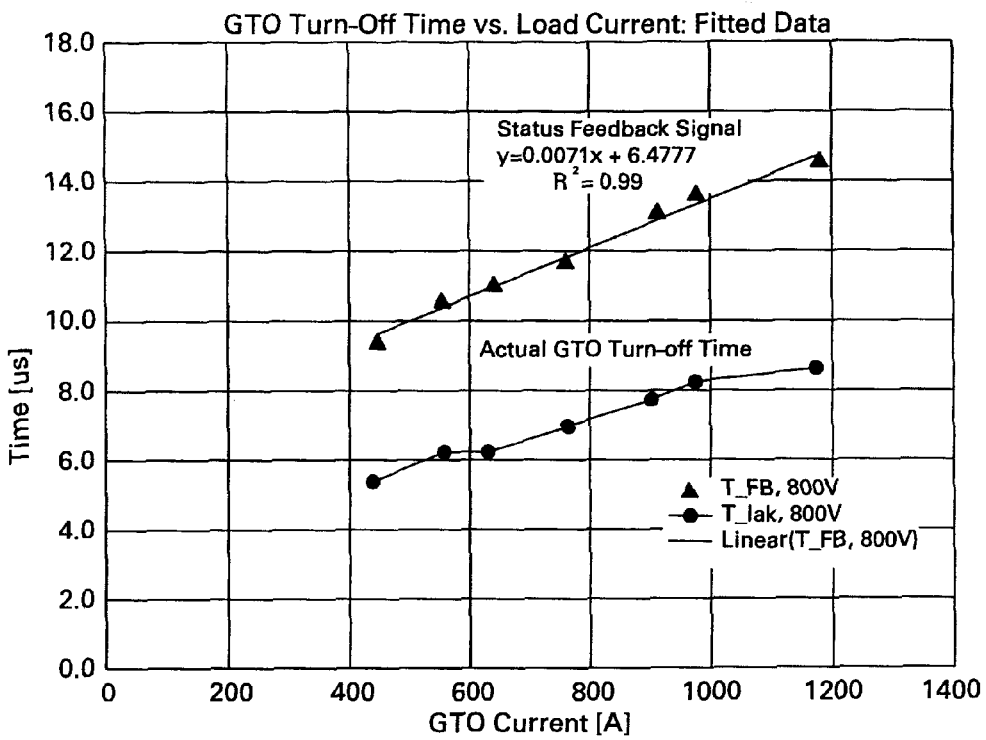
FIG. 4 is a graph illustrating test data for power electronic device turn-off versus power electronic device current.

FIG. 4 is a graph illustrating test data for power electronic device turn-off versus power electronic device current. In one set of tests, switching times of the GTO were monitored and recorded for various levels of current, voltage, and temperature. FIG. 4 represents GTO turn-off times plotted against GTO anode current. It was noted that turn-off time ($T_{off}$) of the GTO exhibited a linear relationship to the current ($I_{ak}$) of the GTO. The linear relationship was additionally reflected in the timing of the feedback signal (that is, the status signal) from the gate driver to the converter controller. The relationship between $T_{off}$ and $I_{ak}$ can be fitted to a straight line through linear regression with a high coefficient of determination ($R^2$ value). Thus, the test data illustrated that a suitable, normalized signature for a GTO/gate driver pair can be formed from the switching times of the GTO and that the signature will remain relatively de-coupled from the normal operating range and conditions of the power electronic converter.

Figure 5:
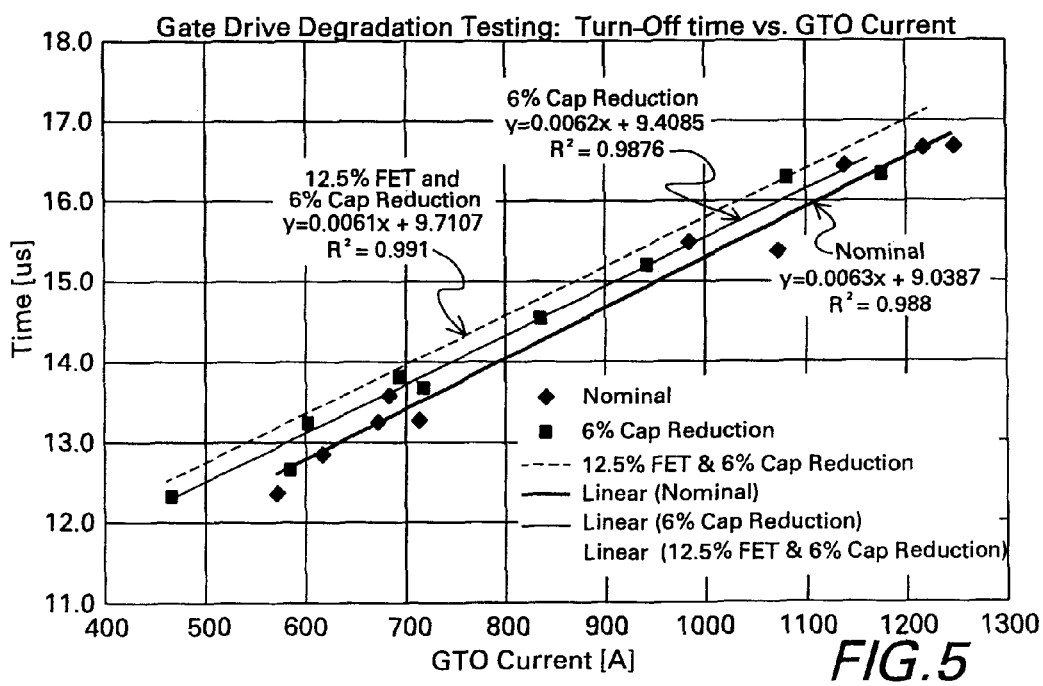
FIG. 5 is a graph illustrating degradation of a power electronic device gate driver and a resulting signature change.

FIG. 5 is a graph illustrating degradation of a power electronic device gate driver and a resulting signature change. In a subsequent set of tests from those used to generate FIG. 4, a GTO/gate driver pair was intentionally modified to exhibit typical degradation attributes.

After taking a nominal set of switching data, the gate driver had one of its sixteen turn-off circuit electrolytic capacitors (not shown) removed, thus incurring a 6% (1 out of 16) reduction in capacitance. In FIG. 5 it can be seen that this reduction in capacitance results in a clearly noticeable change in the linear regression, or signature, of the switching data. Thus, degradation of the gate driver supply capacitance over time and temperature can be detected in the signature.

The turn-off circuit in the GTO gate driver included several power MOSFETs (not shown) operating in parallel. To evaluate the failure of one of these MOSFETs, the gate driver was again modified to disconnect 1 (out of 8) of these MOSFETs for a resulting 12.5% loss of gate driver switch capacity. FIG. 5 again shows a noticeable change in the linear regression, or signature, of the switching data. Thus, degradation and/or partial failure of the gate driver turn-off circuitry over time and temperature can be detected in the signature.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for monitoring the health of power electronics comprising:

providing at least one switch command to at least one power electronic device through at least one gate driver;

measuring at least one switching time of the at least one power electronic device; and using the at least one switching time to determine at least one diagnostic condition of the at least one power electronic device or the at least one gate driver.

2. The method of claim 1 wherein measuring the at least one switching time comprises measuring at least two switching times with one of the at least two switching times comprising a turn-on time and the other of the at least two switching times comprising a turn-off time.

3. The method of claim 2 further including storing each of the turn-on and turn-off times.

4. The method of claim 3 wherein using the at least one switching time to determine the at least one diagnostic condition includes trending the turn-on and turn-off times.

5. The method of claim 4 wherein storing each of the turn-on and turn-off times and trending the turn-on and turn-off times occur at a location remote from the power electronics.

6. The method of claim 3 further including, prior to storing each of the turn-on and turn-off times, normalizing each of the turn-on and turn-off times.

7. The method of claim 6 wherein normalizing includes using at least one of the parameters of current in the power electronic device, ambient temperature, and bus voltage in the power electronics.

8. The method of claim 1 wherein the at least one power electronic device comprises each power electronic device in the power electronics.

9. The method of claim 1 wherein using the at least one switching time to determine the at least one diagnostic condition further includes gauging degradation in the at least one power electronic device or the at least one gate driver.

10. The method of claim 9 wherein using the at least one switching time to determine the at least one diagnostic condition further includes predicting a failure in the at least one power electronic device or the at least one gate driver.

11. A method for monitoring the health of power electronics comprising:

providing at least one switch command to at least one power electronic device through at least one gate driver;

measuring at least one switching time of the at least one power electronic device; and using the at least one switching time to predict a failure in the at least one power electronic device or the at least one gate driver.

12. A power electronics health monitoring system comprising a control system for providing at least one switch command to at least one power electronic device through at least one gate driver; measuring at least one switching time of the at least one power electronic device; and using the at least one switching time to determine at least one diagnostic condition of the at least one power electronic device or the at least one gate driver.

13. The system of claim 12 wherein the control system includes a remote data collector for using the at least one switching time to monitor the at least one diagnostic condition.

14. The system of claim 12 wherein the control system normalizes the at least one switching time prior to using the at least one switching time to monitor the at least one diagnostic condition.

15. The system of claim 12 wherein the at least one power electronic device comprises each power electronic device in the power electronics.

16. A power electronics health monitoring system comprising:

means for providing at least one switch command to at least one power electronic device through at least one gate driver;

means for measuring at least one switching time of the at least one power electronic device; and means for using the at least one switching time to monitor at least one diagnostic condition of the at least one power electronic device or the at least one gate driver.

17. The system of claim 16 wherein the means for measuring the at least one switching time comprises measuring at least two switching times with one of the at least two switching times comprising a turn-on time and the other of the at least two switching times comprising a turn-off time.

18. The system of claim 17 wherein the means for using the at least one switching time to monitor the at least one diagnostic condition of the at least one power electronic device or the at least one gate driver includes means for storing each of the turn-on and turn-off times.

19. The system of claim 18 wherein the means for using the at least one switching time to monitor the diagnostic condition includes means for trending the turn-on and turn-off times.

20. The system of claim 16 wherein the means for using the at least one switching time to monitor the diagnostic condition further gauges degradation in the at least one power electronic device or the at least one gate driver.

21. The system of claim 20 wherein the means for using the at least one switching time to monitor the at least one diagnostic condition further predicts a failure in the at least one power electronic device or the at least one gate driver.

* * * * *